United States Patent [19]

Carlsten

[11] Patent Number: 4,845,379
[45] Date of Patent: Jul. 4, 1989

[54] SENSE CIRCUIT FOR DETECTING ABSENCE OF A PULSE TRAIN

[75] Inventor: Ronald W. Carlsten, Tucson, Ariz.

[73] Assignee: International Business Machines Corporation, Armonk, N.Y.

[21] Appl. No.: 215,183

[22] Filed: Jul. 5, 1988

[51] Int. Cl.⁴ .......................... H03K 5/19; H03K 9/06
[52] U.S. Cl. ................................... 328/120; 328/146; 328/149; 328/140; 307/362; 307/354; 307/518; 307/519; 307/494
[58] Field of Search ............... 328/120, 147, 140, 146, 328/149; 307/518, 234, 354, 519, 362, 494

[56] References Cited

U.S. PATENT DOCUMENTS

| | | | |
|---|---|---|---|
| 2,847,565 | 8/1958 | Clapper | 250/27 |
| 3,068,367 | 12/1962 | Brown et al. | 307/88.5 |
| 3,069,558 | 12/1962 | Burt et al. | 307/88.5 |
| 3,149,243 | 9/1964 | Garfield | 307/88.5 |
| 3,187,202 | 6/1965 | Case | 307/88.5 |
| 3,258,669 | 6/1966 | Krassoievitch | 318/314 |
| 3,264,496 | 8/1966 | Scholl | 307/88.5 |
| 3,305,732 | 2/1967 | Grossman et al. | 307/88.5 |
| 3,403,269 | 9/1968 | Thompson | 307/293 |
| 3,405,234 | 10/1968 | West | 178/66 |
| 3,497,816 | 2/1970 | Fritz et al. | 328/138 |
| 3,506,848 | 4/1970 | Beurrier | 307/234 |
| 3,514,685 | 5/1970 | Burgess | 318/313 |
| 3,522,544 | 8/1970 | Saldutti et al. | 328/138 |
| 3,653,018 | 3/1972 | Budrys | 340/248 |
| 3,790,818 | 2/1974 | Bruckner | 307/235 |
| 3,940,698 | 2/1976 | Itoh | 325/348 |
| 4,158,148 | 6/1979 | Teller | 307/233 |
| 4,262,213 | 4/1981 | Eichelberger et al. | 307/40 |
| 4,322,642 | 3/1982 | Sugasawa | 307/522 |
| 4,746,820 | 5/1988 | Fey | 307/524 |

OTHER PUBLICATIONS

Markus, John: "Modern Electronic Circuits Reference Manual", McGraw-Hill 1980, p. 764.
"Signetics Analog Data Manual", Signetics, Sunnyvale, CA, 1977, p. 723.

Primary Examiner—Stanley D. Miller
Assistant Examiner—Nancy Thai
Attorney, Agent, or Firm—Manny W. Schecter

[57] ABSTRACT

A low-cost circuit capable of detecting the absence of a pulse train such as the pulse train generated by a fan cooling output circuit of open collector design. The detection circuit is capable of sensing that a pulse output has stopped in either a high or low state by converting the pulse train to a level that can be compared to a reference. The circuit design insures that the steady state voltage level decays to an under voltage value when the pulse train stops regardless of whether the fan output stops in a high or low state.

7 Claims, 1 Drawing Sheet

SENSE CIRCUIT FOR DETECTING ABSENCE OF A PULSE TRAIN

BACKGROUND OF THE INVENTION

1. Field of the Invention

Many solid state power supplies require forced air cooling in order to meet desired operational levels. To provide such cooling, it is common to use DC fans which include a rotation sensor providing an electrical output signal that drives an open collector transistor on and off as an indication when the fan is operating. With such open collector circuits, when the rotation of the fan is stopped, the output of the output transistor may assume either a high, for example 5 volt, or low, for example 0.5 volt, state depending upon the reference voltage value and the position of the rotor of the fan when it stops. Since most conventional sensing circuits use active logic to detect a missing pulse, it is difficult with conventional circuits to sense when such a DC fan has stopped, in order to provide an error or fault indication.

2. Description of the Prior Art

Various sensing circuits exist in the prior art to detect missing pulse signals and/or to detect error signals in response to the occurrence of a predetermined condition in semiconductor circuits. However, Applicant is not aware of a circuit which converts pulses of a pulse train to a DC level that can be compared to a reference, with the circuit insuring that a steady state voltage level exists that will decay to a constant lower value when the pulse train is interrupted, regardless of whether the output of the pulse train is stopped in a high or a low state.

SUMMARY OF THE INVENTION

Accordingly, it is an object of the invention to provide a low-cost circuit capable of detecting the absence of a pulse train which is interrupted with an output condition in either a high voltage or a low voltage state.

It is a further object of the invention to provide a low-cost circuit for sensing the absence of such a pulse train by converting the pulses of the train to a DC level that can be compared to a predetermined reference.

It is yet a further object of the invention to provide in such a circuit a design that insures that the steady state voltage level being sensed is converted to a DC level that decays to an under voltage value when the pulse train stops, regardless of whether the pulse train output stops in a high voltage or low voltage condition.

These objects and further advantages of the invention are obtained in a circuit which includes means for converting the pulses generated to form the pulse train into a DC level that can be sensed with an under voltage sensed comparator such as that generally used on switching power supplies. The circuit of the invention includes means to insure that the steady state voltage level obtained in the conversion of the pulse train will decay to an under voltage value when the pulse train stops, regardless of whether the output of the circuit being sensed stops in a high or low voltage condition.

The circuit is further unique in that it can be adjusted to be sensitive to a predetermined number of missing pulses before an alarm condition is actuated.

BRIEF DESCRIPTION OF THE DRAWINGS

Other features and advantages of the invention are described in the following detailed description, taken in conjunction with the accompanying drawings wherein

FIG. 2 is a waveform representing the open collector transistor voltage of a fan circuit which the sensor circuit is to be used in conjunction with;

DETAILED DESCRIPTION OF THE DRAWINGS

Figure 1:
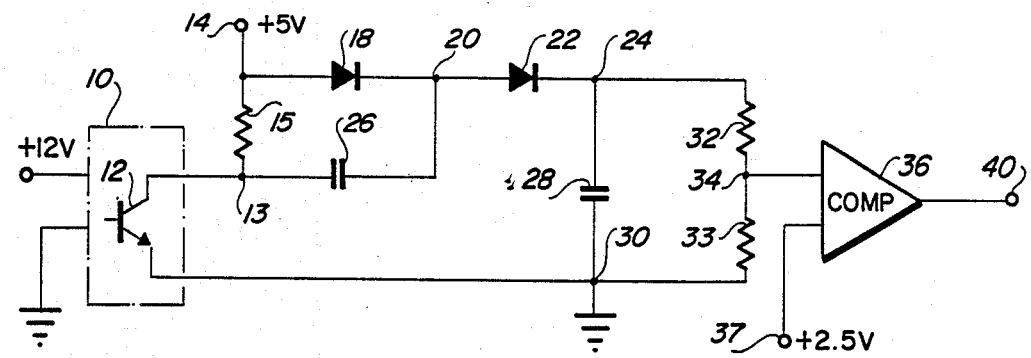
FIG. 1 is a schematic of the sensor circuit of the invention.

Referring now to the drawings, and particularly to FIG. 1, a preferred embodiment of the invention is described. Numeral 10 in FIG. 1 identifies a portion of a basic cooling fan such as that commonly used to provide forced air cooling for semiconductor power supplies. As shown, the fan is commonly supplied with a +12 volt power supply input and has a grounded input, as well. The circuit details of the fan are conventional and are not illustrated. However, it should be understood that such fans usually have a DC rotor that provides an output signal when the fan is stopped. In the case of this type of fan, a rotation sensor provides a bias signal that controls an open collector transistor 12, i e. switches it on and off as the fan rotates. Thus, the operation of the rotation sensor and the fan produce an output in conventional fashion at node 13 of the open collector circuit that comprises a pulse train similar to that illustrated in FIG. 2 of the drawings.

Figure 2:
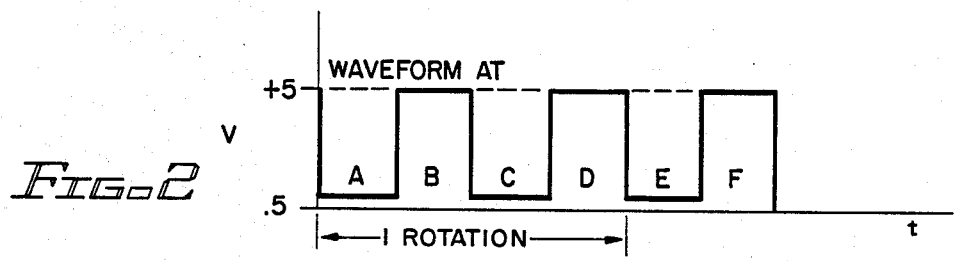

Referring particularly to FIG. 2, it can be seen that an alternating waveform is produced at node 13 which is a pulse train varying between a +5 volt output and a 0.5 volt output.

Referring again to FIG. 1, the sensor circuit of the invention is described. A +5 volt input is provided at a node 14, with a resistor 15 being connected between node 13 and node 14. A diode 18 is connected with polarity as indicated between node 14 and node 20, and a diode 22 is connected between node 20 and node 24, again with polarity as indicated. A capacitor 26 is connected between node 13 and node 20, and a capacitor 28 is connected between node 24 and node 30. Resistors 32, 33 are connected in series between node 24 and node 30 so that they appear in electrical parallel with capacitor 28. Node 30 is also connected to ground and to the emitter of transistor 12. A node 34 between resistors 32, 33 is provided as the input of an under voltage sensing comparator 36, which also receives a +2.5 volt input on a second input from node 37. The output of the under voltage sensing comparator is provided on node 40 and comprises a fan sense output signal.

When the power supply is turned on, the 12 volt signal is provided to the fan by the power supply circuit along with the 5 volt and 2.5 volt inputs illustrated in FIG. 1. When the fan rotates, it generates the waveform shown in FIG. 2 at the open collector circuit as indicated at node 13.

Referring to FIG. 2, as the transistor is turned on (in regions A, C, E of the waveform), current flows from the +5 volt supply through diode 18 and capacitor 26 to ground. This eventually charges capacitor 26 to about 4 volts ($+5V - V_{D18} - Vce$ sat.). When transistor 12 is turned off (as indicated in regions B, D, and F of FIG. 2), capacitor 28 will charge to about 8 volts ($+5V+V_{C26}-V_{D22}$). This charge is effected by the +5 volt signal applied through resistor 15 and the voltage action of capacitor 26 discharging through diode 22. When the transistor turns back on, as in region C, capacitor 26 will again charge through the diode 18 to about 4 volts. During this time, capacitor 28 will start to discharge due to the voltage divider load of R32 and R33. However, since the voltage at C28 is higher than the voltage on C26, diode 22 will be reverse biased and have no effect upon the charging of C26.

In region D of the waveform, the transistor has again turned off, thus allowing C28 to charge again through diode 22, C26 and the +5 volts supply. Due to this sequence, under normal operation, a steady state DC voltage is eventually developed at node 24 which is higher than the +5 voltage at node 14, i e. about 8 volts. The divider of R32 and R33 is used to divide the 8 volts down to a predetermined sense level of about 2.5 volts.

Figure 3:
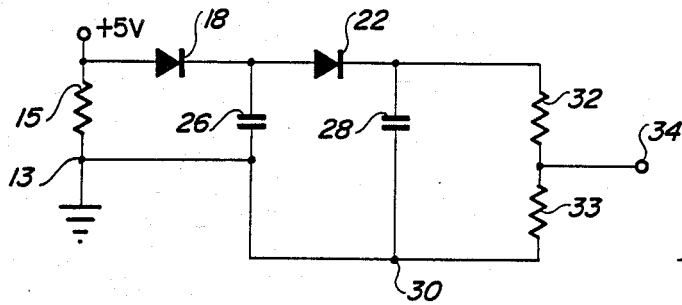
FIG. 3 is an equivalent circuit useful in understanding the operation of the sensor circuit of FIG. 1 with the open collector transistor in an on state.

When the fan stops turning, transistor 12 will provide an output of either a high voltage (+5 V)or a low voltage (0.5 V) state When the rotor stops with the transistor in the "on" state, the equivalent circuit is that shown in FIG. 3. Capacitor 26 will charge to +4 volts. Capacitor 28 will initially be charged to about 8 volts and will start to decay due to the load of resistor 32 and resistor 33. The voltage at C28 will decay until it reaches the 4 volts seen on C26. At this time, diode 22 will start to conduct allowing C28 to stay charged at a diode drop below the voltage of C26, i.e. about 3.5 volts. In view of the value of R32, the voltage at node 34 is then below the under voltage sense point of 2.5 V, causing an error signal from the comparator which can be utilized to shut the power supply off.

Figure 4:
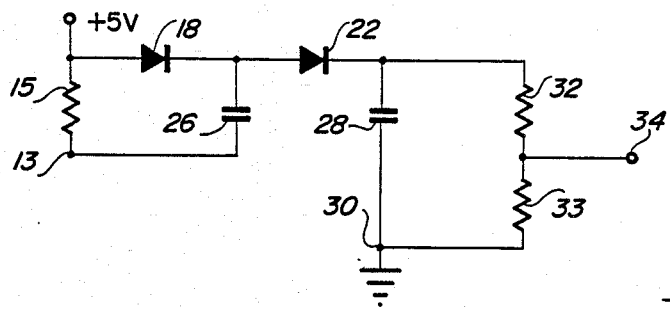
FIG. 4 is an equivalent circuit useful in understanding the operation of the sensor circuit of FIG. 1 with the open collector transistor in the off state.

When the rotor stops with the transistor in the "off" state, the equivalent circuit is that shown in FIG. 4 with no direct circuit connection between node 13 and node 30. Thus, C28 will discharge due to the resistor 32 and resistor 33 load, at the same time C26 is discharging into C28. C28 will continue to discharge until it reaches about 3.5 volts, at which time C26 will be completely discharged and D18 and D22 will be forward biased, maintaining C28 charged at about 3.5 volts. As occurs in the "on" state, the voltage at node 34 is then below the under voltage sense point. This again causes the error signal to occur at node 40, which can be used to turn the power supply off.

The unique feature of this extremely low-cost circuit is that an under voltage signal will be developed no matter which state the fan sense transistor stops in, either "on" or "off".

In the preferred embodiment component values were selected as follows:

R15=1 K ohms,
R32=33.2 K ohms,
R33=15 K ohms,
C26=6.8 microfarads,
C28=15 microfarads.

While the invention has been particularly shown and described with reference to a preferred embodiment thereof, it will be understood by those skilled in the art that various changes in form and details may be made therein without departing from the spirit and scope of the invention:

What is claimed is:

1. A sensing circuit for detecting the absence of pulses in a pulse train comprising:
   a first terminal connected to the pulse train source, a first resistor connected between a voltage source terminal and the first terminal;
   a diode having its anode connected to the voltage source terminal;
   a capacitor having one terminal connected to said first terminal and another terminal connected to the cathode of the first diode;
   a second diode having its anode connected to the cathode of the first diode and having its cathode connected to one terminal of a second capacitor;
   the other terminal of the second capacitor being connected to ground; and
   third and fourth resistors being connected in series between the cathode of the second diode and ground, and a comparator receiving a first input from the junction point of said second and third resistors and receiving a second input from another reference signal terminal, and an output terminal connected to the output of the comparator for receiving a pulse error signal.

2. A sensing circuit for detecting the absence of pulses upon the interruption of an alternating pulse train comprising:
   an input node for receiving the pulse train;
   voltage conversion means connected to the input node for converting the pulses of the pulse train to a steady state DC signal level higher than the voltage level of the alternating pulses; and
   comparator means connected to the conversion means for comparing the DC signal level with a reference voltage, the comparator means producing an output when the DC level of the conversion means falls below the reference voltage level as a result of the absence of pulses from the pulse train regardless of the state in which the pulse train is interrupted.

3. The sensing circuit of claim 2 wherein the conversion means includes first and second unidirectional means connected together, first charging means connected between said input node and the common juncture of the unidirectional means, and second charging means connected to the output of the second unidirectional means.

4. The sensing circuit of claim 3 further including a voltage divider means connected to the common juncture of the second unidirectional means and the second charging means and having the center of the divider network connected as an input to the comparator means.

5. The reference sensing circuit of claim 4 wherein said unidirectional means are diodes and said charging means are capacitors.

6. The sensing circuit of claim 5 wherein a reference terminal is connected to the anode of the first diode and a resistor is connected between the reference terminal and the input node.

7. The sensing circuit of claim 6 wherein the anode of the second diode is connected to the cathode of the first diode.

* * * * *